United States Patent
Kang et al.

(10) Patent No.: US 11,605,792 B2
(45) Date of Patent: Mar. 14, 2023

(54) FLEXIBLE SUBSTRATE AND MANUFACTURING METHOD THEREOF, PANEL AND ELECTRONIC DEVICE

(71) Applicants: MIANYANG BOE OPTOELECTRONICS TECHNOLOGY CO., LTD., Sichuan (CN); BOE TECHNOLOGY GROUP CO., LTD., Beijing (CN)

(72) Inventors: Shilei Kang, Beijing (CN); Jun Zhao, Beijing (CN); Ganghao Fan, Beijing (CN); Hui Luo, Beijing (CN)

(73) Assignees: MIANYANG BOE OPTOELECTRONICS TECHNOLOGY CO., LTD., Sichuan (CN); BOE TECHNOLOGY GROUP CO., LTD., Beijing (CN)

(*) Notice: Subject to any disclaimer, the term of this patent is extended or adjusted under 35 U.S.C. 154(b) by 614 days.

(21) Appl. No.: 16/480,513

(22) PCT Filed: Dec. 20, 2018

(86) PCT No.: PCT/CN2018/122387
§ 371 (c)(1),
(2) Date: Jul. 24, 2019

(87) PCT Pub. No.: WO2019/144734
PCT Pub. Date: Aug. 1, 2019

(65) Prior Publication Data
US 2021/0328158 A1    Oct. 21, 2021

(30) Foreign Application Priority Data

Jan. 25, 2018   (CN) .......................... 201810073541.5

(51) Int. Cl.
*H01L 51/00* (2006.01)
*H01L 51/52* (2006.01)
(Continued)

(52) U.S. Cl.
CPC .......... *H01L 51/0097* (2013.01); *H01L 51/56* (2013.01); *G02F 1/133305* (2013.01);
(Continued)

(58) Field of Classification Search
CPC ............. H01L 51/0097; H01L 51/5253; H01L 51/5256; H01L 2251/5338;
(Continued)

(56) References Cited

U.S. PATENT DOCUMENTS 6,900,084 B1 * 5/2005 Yamazaki ............. G02F 1/1339
438/30
7,176,621 B2 * 2/2007 Do ......................... H05B 33/10
313/506
(Continued)

FOREIGN PATENT DOCUMENTS

CN    103810945 A    5/2014
CN    103996629 A    8/2014
(Continued)

OTHER PUBLICATIONS

Extended European Search Report dated Sep. 16, 2021; Appln. No. 18900567.1.
(Continued)

*Primary Examiner* — Ida M Soward

(57) ABSTRACT

A flexible substrate is provided, and the flexible substrate includes a second organic layer, a first inorganic layer, a first organic layer, and a second inorganic layer, which are sequentially stacked. A surface, which is in contact with the first organic layer, of the first inorganic layer has a first groove. A surface, which is in contact with the first inorganic layer, of the second organic layer has a second groove. A surface, which is in contact with the second inorganic layer, of the first organic layer has a third groove. In a direction perpendicular to the first inorganic layer, any two of the first groove, the second groove and the third groove at least partially are not aligned with each other. A manufacturing method of the flexible substrate, a panel including the
(Continued)

flexible substrate, and an electronic device including the flexible substrate are also provided.

20 Claims, 9 Drawing Sheets

(51) Int. Cl.

| | |
|---|---|
| *H01L 33/44* | (2010.01) |
| *G02F 1/13* | (2006.01) |
| *G06F 1/16* | (2006.01) |
| *G06F 9/30* | (2018.01) |
| *H01L 51/56* | (2006.01) |
| *G09F 9/30* | (2006.01) |
| *G02F 1/1333* | (2006.01) |

(52) U.S. Cl.
CPC .......... *G06F 1/1641* (2013.01); *G06F 1/1652* (2013.01); *G09F 9/301* (2013.01); *G09G 2330/04* (2013.01); *G09G 2330/045* (2013.01); *H01L 33/44* (2013.01); *H01L 2251/301* (2013.01); *H01L 2251/5338* (2013.01)

(58) Field of Classification Search
CPC .............. H01L 2251/301; H01L 33/44; G09G 2330/04; G09G 2330/045; G02F 2001/133357; G02F 1/133305; G06F 1/1641; G06F 1/1652; G09F 9/301
See application file for complete search history.

(56) References Cited

U.S. PATENT DOCUMENTS

| | | | |
|---|---|---|---|
| 8,946,747 B2* | 2/2015 | Reiherzer | ............... H01L 33/54 257/94 |
| 9,070,889 B2* | 6/2015 | Lee | ..................... H01L 51/5256 |
| 9,697,764 B2 | 7/2017 | Kim et al. | |
| 10,079,362 B2* | 9/2018 | Kim | ....................... H01L 51/56 |
| 10,177,344 B2* | 1/2019 | Wang | .................. H01L 51/5268 |
| 10,181,578 B2* | 1/2019 | Li | ......................... H01L 51/004 |
| 10,224,497 B2 | 3/2019 | Meng et al. | |
| 10,243,174 B2* | 3/2019 | Li | .......................... H01L 51/529 |
| 2005/0276211 A1* | 12/2005 | Hirotsune | .......... G11B 7/24038 |
| 2013/0334959 A1* | 12/2013 | Wang | .................. H01L 51/5256 313/512 |
| 2016/0164047 A1 | 6/2016 | Komoriya et al. | |
| 2016/0365539 A1* | 12/2016 | Wang | ..................... H01L 31/12 |
| 2017/0104183 A1* | 4/2017 | Li | ....................... H01L 51/5253 |
| 2017/0115818 A1* | 4/2017 | Cai | ....................... G06F 3/0412 |
| 2017/0117504 A1* | 4/2017 | Kim | .................... H01L 27/3244 |
| 2017/0154935 A1 | 6/2017 | Cai | |
| 2017/0214000 A1 | 7/2017 | Li et al. | |
| 2017/0352717 A1* | 12/2017 | Choi | ................... H01L 27/3276 |
| 2018/0104915 A1* | 4/2018 | Liu | ......................... B29C 69/02 |
| 2018/0151833 A1* | 5/2018 | Riegel | ................ H01L 51/5253 |
| 2018/0212186 A1* | 7/2018 | Jin | ..................... H01L 51/5262 |
| 2018/0321764 A1* | 11/2018 | Oh | ..................... H01L 27/3276 |
| 2021/0144871 A1* | 5/2021 | Araki | ................... G06F 1/1652 |
| 2022/0059643 A1* | 2/2022 | Lee | ..................... H01L 27/1244 |

FOREIGN PATENT DOCUMENTS

| | | | | |
|---|---|---|---|---|
| CN | 104538425 A | | 4/2015 | |
| CN | 105552246 A | * | 5/2016 | |
| CN | 105702624 A | | 6/2016 | |
| CN | 105870355 A | * | 8/2016 | |
| CN | 105977398 A | * | 9/2016 | ......... H01L 51/5237 |
| CN | 106328826 A | * | 1/2017 | ......... H01L 51/5253 |
| CN | 106847832 A | | 6/2017 | |
| CN | 206610830 U | | 11/2017 | |

OTHER PUBLICATIONS

Second Chinese Office Action dated Mar. 24, 2021; Appln. No. 201810073541.5.

* cited by examiner

FLEXIBLE SUBSTRATE AND MANUFACTURING METHOD THEREOF, PANEL AND ELECTRONIC DEVICE

The application claims priority to the Chinese patent application No. 201810073541.5, filed on Jan. 25, 2018, the entire disclosure of which is incorporated herein by reference as part of the present application.

TECHNICAL FIELD

At least one embodiment of the present disclosure relates to a flexible substrate and a manufacturing method thereof, a panel and an electronic device.

BACKGROUND

With a rapid development of full-screen mobile phones, a market influence of flexible display substrates such as flexible organic light emitting diode (OLED) display substrates is increased gradually. In a flexible OLED display substrate, the OLED is formed on a flexible substrate. A structure and design of the flexible substrate are decisive factors for a bending ability of the flexible OLED display substrate.

SUMMARY

At least one embodiment of the present disclosure provides a flexible substrate, and the flexible substrate comprises: a first inorganic layer and a first organic layer; the first organic layer is on the first inorganic layer and in contact with the first inorganic layer, and a surface, which is in contact with the first organic layer, of the first inorganic layer has a first groove.

For example, the flexible substrate provided by at least one embodiment of the present disclosure further comprises a second organic layer on a side, which is away from the first organic layer, of the first inorganic layer and in contact with the first inorganic layer; a surface, which is in contact with the first inorganic layer, of the second organic layer has a second groove.

For example, the flexible substrate provided by at least one embodiment of the present disclosure further comprises a second inorganic layer on a side, which is away from the first inorganic layer, of the first organic layer and in contact with the first organic layer; a surface, which is in contact with the second inorganic layer, of the first organic layer has a third groove.

For example, in the flexible substrate provided by at least one embodiment of the present disclosure, in a direction perpendicular to the first inorganic layer, any two of the first groove, the second groove and the third groove at least partially are not aligned with each other.

For example, the flexible substrate provided by at least one embodiment of the present disclosure further comprises a second inorganic layer on a side, which is away from the first inorganic layer, of the first organic layer; a surface, which is away from the first organic layer, of the second inorganic layer is a flat surface.

For example, the flexible substrate provided by at least one embodiment of the present disclosure further comprises a planarization layer covering the second inorganic layer; a surface, which is away from the second inorganic layer, of the planarization layer is a flat surface.

For example, in the flexible substrate provided by at least one embodiment of the present disclosure, at least one of an orthographic projection of the first groove on the first inorganic layer, an orthographic projection of the second groove on the first inorganic layer and an orthographic projection of third groove on the first inorganic layer is in a strip shape or in a dot shape.

For example, in the flexible substrate provided by at least one embodiment of the present disclosure, each of a material of the first organic layer and a material of the second organic layer comprises one or more of polyimide, polyester and polyfluoride.

For example, in the flexible substrate provided by at least one embodiment of the present disclosure, each of a material of the first inorganic layer and a material of the second inorganic layer comprises one or more of silicon oxide, silicon nitride and silicon oxynitride.

For example, the flexible substrate provided by at least one embodiment of the present disclosure further comprises a function layer on the first organic layer and comprising a working region and a non-working region outside the working region; at least one of an orthographic projection of the first groove on the function layer, an orthographic projection of the second groove on the function layer and an orthographic projection of the third groove on the function layer at least partially overlaps with the non-working region.

At least one embodiment of the present disclosure further provides a panel comprising any one of the flexible substrates provided by embodiments of the present disclosure.

At least one embodiment of the present disclosure further provides an electronic device comprising any one of the panels provided by embodiments of the present disclosure.

At least one embodiment of the present disclosure further provides a manufacturing method of a flexible substrate, comprising: providing a base substrate; forming a first inorganic layer on the base substrate; forming a first groove on a surface, which is away from the base substrate, of the first inorganic layer; and forming a first organic layer in contact with the first inorganic layer on the first inorganic layer.

For example, the manufacturing method provided by at least one embodiment of the present disclosure further comprises forming a second organic layer on a side, which is away from the first organic layer, of the first inorganic layer and in contact with the first inorganic layer; and forming a second groove on a surface, which is in contact with the first inorganic layer, of the second organic layer.

For example, the manufacturing method provided by at least one embodiment of the present disclosure further comprises forming a second inorganic layer in contact with the first organic layer on the first organic layer; and forming a third groove on a surface, which is in contact with the second inorganic layer, of the first organic layer.

For example, the manufacturing method provided by at least one embodiment of the present disclosure further comprises forming a second inorganic layer on the first organic layer, the surface of the second inorganic layer which is away from the first organic layer is a flat surface.

For example, the manufacturing method provided by at least one embodiment of the present disclosure further comprises forming a planarization layer covering the second inorganic layer; a surface, which is away from the second inorganic layer, of the planarization layer is a flat surface.

For example, in the manufacturing method provided by at least one embodiment of the present disclosure, the first groove is formed by a photolithography process.

For example, in the manufacturing method provided by at least one embodiment of the present disclosure, at least one of the second groove and the third groove is formed by an imprint process.

For example, the manufacturing method provided by at least one embodiment of the present disclosure further comprises forming a function layer on the base substrate; the function layer comprises a working region and a non-working region outside the working region, and at least one of an orthographic projection of the first groove on the function layer, an orthographic projection of the second groove on the function layer and an orthographic projection of the third groove on the function layer at least partially overlaps with the non-working region.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. Also, the terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "Inside," "outside" "on," "under," and the like are only used to indicate relative position relationship, and when the position of the object which is described is changed, the relative position relationship may be changed accordingly.

The figures in embodiments of the present disclosure are not drawn according to actual proportions or scales. An amount of the first groove, an amount of the second groove and an amount of the third groove are not limited to amounts illustrated in the figures, specific size of each structure can be determined according to actual acquirements, and the figures of the embodiments of the present disclosure are only schematic views.

The figures only illustrate structures related to the columnar spacers, and other structures can be referred to the common techniques.

It should be noted that the description "the non-working region is outside the working region" means that the non-working region surrounds at least a part of the working region or the non-working region is at a side, which is close to an out edge of the base substrate, of the working region.

Figure 1:
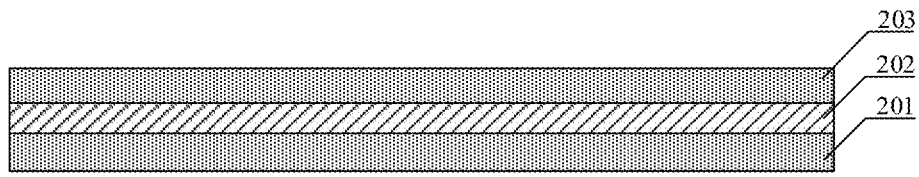
FIG. 1 is a structural schematic diagram of a substrate.

FIG. 1 is a structural schematic diagram of a substrate. For example, the substrate is a flexible substrate. The substrate includes a first silicon dioxide layer 201, a polyimide layer 202 and a second silicon dioxide 203. The polyimide layer 202 is located on the first silicon dioxide layer 201 and in contact with the first silicon dioxide layer 201, and the second silicon dioxide layer 203 is on the polyimide layer 202 and in contact with the polyimide layer 202. Both of a surface, which is in contact with the polyimide layer 202, of the first silicon dioxide layer 201 and a surface, which is in contact with the second silicon dioxide layer 203, of the polyimide layer 202 are flat surfaces. For example, in a case where an OLED device is disposed on the second silicon dioxide layer 203, the first silicon dioxide layer 201 and the second silicon dioxide layer 203 respectively on two sides of the polyimide layer 202 play a role of isolating moisture and oxygen to protect the OLED device. The polyimide layer 202 is usually formed by a coating process. After heating and curing the polyimide layer 202, a bonding strength between the polyimide layer 202 and the first silicon dioxide layer 201 is usually weak, which easily causes defects such as separation or warp or the like between the polyimide layer 202 and the first silicon dioxide layer 201 in a subsequent manufacturing process, and thus a yield rate of the flexible substrate is affected.

At least one embodiment of the present disclosure provides a flexible substrate, and the flexible substrate comprises: a first inorganic layer and a first organic layer. The first organic layer is on the first inorganic layer and in contact with the first inorganic layer, and a surface, which is in contact with the first organic layer, of the first inorganic layer has a first groove. For example, the flexible substrate is a flexible display substrate or a flexible lighting substrate. For example, the flexible substrate is used for decorative lamps, and the flexible substrate has a good flexibility and meets requirements for manufacturing decorative lamps in various shapes.

Figure 2A:
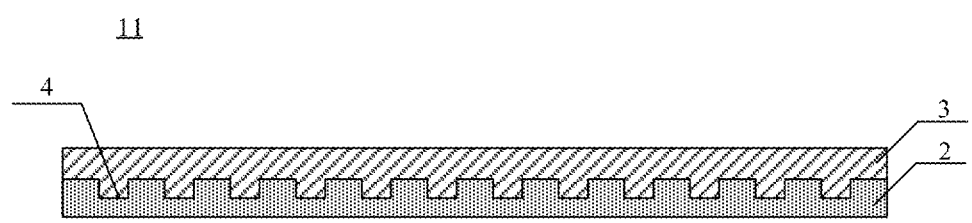
FIG. 2A is a structural schematic diagram of a flexible substrate provided by at least one embodiment of the present disclosure.

For example, FIG. 2A is a structural schematic diagram of a flexible substrate provided by at least one embodiment of the present disclosure. As illustrated in FIG. 2A, the flexible substrate includes a first inorganic layer 2 and a first organic layer 3. The first organic layer 3 is on the first inorganic layer 2 and in contact with the first inorganic layer 2, and a surface, which is in contact with the first organic layer 3, of the first inorganic layer 2 has a first groove 4. For example, under a situation of other conditions being same, a main factor affecting a bonding strength between the first organic layer 3 and the first inorganic layer 2 is a contact area. Thus, the contact area between the first organic layer 3 and the first inorganic layer 2 is increased by providing the first groove 4, so that an adhesion force between the first organic layer 3 and the first inorganic layer 2 is enhanced, and the bonding strength between the first organic layer 3 and the first inorganic layer 2 is improved. For example, in at least one embodiment according to the present disclosure, in a case where the first organic layer 3 is formed on the first inorganic layer 2 by a method of coating or the like, problems of a poor bonding strength between the first organic layer 3 and the first inorganic layer 2 and separation or warp easily caused in the subsequent manufacturing process of the flexible substrate are reduced or prevented, which is beneficial to obtaining the flexible substrate with a better flexibility and improving a production yield rate of the flexible substrate.

In the flexible substrate illustrated in FIG. 2A, the first organic layer 3 has a weaker ability of isolating moisture and oxygen, and the first inorganic layer 2 has a better ability of isolating moisture and oxygen, and therefore providing the first inorganic layer 2 enables the flexible substrate to have a better ability of isolating moisture and oxygen, so as to protect a function layer subsequently arranged on the flexible substrate. The first organic layer 3 has an excellent flexibility and is suitable for manufacturing the flexible substrate, so that an encapsulation structure formed by a combination of the first organic layer 3 and the first inorganic layer 2 better isolates moisture and oxygen, and at the same time, better releases stresses caused by bending, deformation and the like of the flexible substrate. In addition, for example, the first organic layer 3 has a good ability of light transmittance, which is beneficial to improving a light transmittance rate of the flexible substrate. For example, the first organic layer 3 has a good ability of high temperature resistance; a light emitting device (for example, an electroluminescent device such as an OLED light emitting device) for example is provided on the flexible substrate, heat produced by the light emitting device during operation may raise a temperature of the flexible substrate, and in this case, the ability of high temperature resistance of the first organic layer 3 stabilizes performances of the flexible substrate to improve a service life of the flexible substrate.

For example, a material of the first organic layer 3 comprises one or more of polyimide, polyester and polyfluoride. Polyimide has an excellent ability of light transmittance, high temperature resistance and breakage resistance, and is suitable for making the flexible substrate. Of course, the material of the first organic layer 3 is not limited to the above listed types.

For example, a material of the first inorganic layer comprises one or more of silicon oxide, silicon nitride and silicon oxynitride. Of course, the material of the first inorganic layer 2 is not limited to the above listed types, as long as the first inorganic layer is an inorganic layer with a better ability of isolating moisture and oxygen.

Figure 2B:
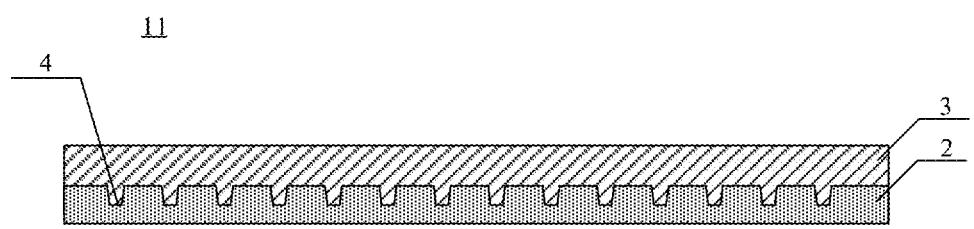
FIG. 2B is another structural schematic diagram of the flexible substrate provided by at least one embodiment of the present disclosure.

For example, a shape of a cross section of the first groove 4 is rectangular as illustrated in FIG. 2A. In another example of the flexible substrate, as illustrated in FIG. 2B, the shape of the cross section of the first groove 4 is trapezoidal as illustrated in FIG. 2B. Other features of the flexible substrate illustrated in FIG. 2B are the same as those of the flexible substrate illustrated in FIG. 2A. FIG. 2A and FIG. 2B only illustrate two examples of the flexible substrate provided by the embodiments of the present disclosure, but the shape of the cross section of the first groove of the flexible substrate provided by the embodiments of the present disclosure is not limited to the case illustrated in FIG. 2A and FIG. 2B.

It should be noted that the cross section of the groove in the disclosure refers to a cross section of the groove in a direction perpendicular to the first inorganic layer.

Figure 3:
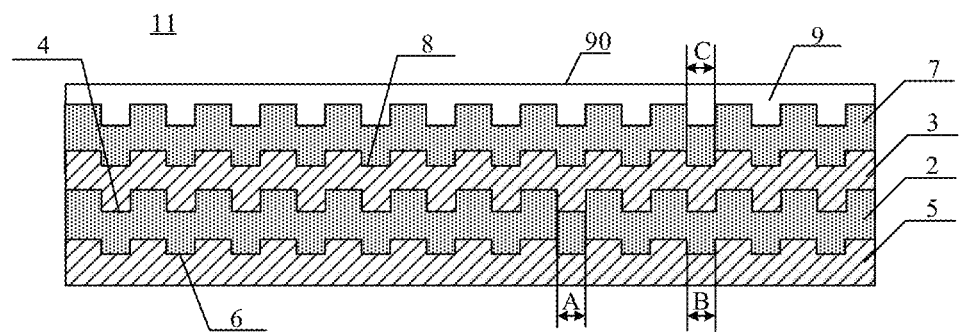
FIG. 3 is further another structural schematic diagram of the flexible substrate provided by at least one embodiment of the present disclosure.

For example, FIG. 3 is a structural schematic diagram of further another flexible substrate provided by at least one embodiment of the present disclosure. As illustrated in FIG. 3, the flexible substrate is different from the flexible substrate illustrated in FIG. 2A in that the flexible substrate further includes a second organic layer 5, a second inorganic layer 7 and a planarization layer 9, and the second organic layer 5 is on a side, which is away from the first organic layer 3, of the first inorganic layer 2 and in contact with the first inorganic layer 2. A surface, which is in contact with the first inorganic layer 2, of the second organic layer 5 has a second groove 6. Compared with a case where the surface, which is in contact with the first inorganic layer 2 of the second organic layer 5 is a flat surface, the second groove 6 increases a contact area between the second organic layer 5 and the first inorganic layer 2. On one hand, a bonding strength between the second organic layer 5 and the first inorganic layer 2 is further improved; on the other hand, the flexibility of the flexible substrate is further enhanced, and thereby problems of separation or warp of the second organic layer 5 and the first inorganic layer 2 easily caused in the subsequent manufacturing process of the flexible substrate are reduced or prevented, which is beneficial to forming the flexible substrate with the better flexibility and improving the production yield rate of the flexible substrate.

In the flexible substrate illustrated in FIG. 3, the second inorganic layer 7 is at a side, which is away from the first inorganic layer 2, of the first organic layer 3 and in contact with the first organic layer 3. A surface, which is in contact with the second inorganic layer 7, of the first organic layer 3 has a third groove 8. A technical effect of the third groove 8 is similar to that of the second groove 6. The third groove 8 increases a contact area between the first organic layer 3 with the second inorganic layer 7. On one hand, a bonding strength between the first organic layer 3 and the second inorganic layer 7 is further improved; on the other hand, the flexibility of the flexible substrate is further enhanced, and thereby the problems of separation or warp of the first organic layer 3 and the second inorganic layer 7 easily caused in the subsequent manufacturing process of the flexible substrate are reduced or prevented, which is beneficial to forming the flexible substrate with the better flexibility and improving the production yield rate of the flexible substrate.

For example, in the structure illustrated in FIG. 3, in the direction perpendicular to the first inorganic layer 2, the first groove 4, the second groove 6 and the third groove 8 are aligned with each other to simplify the manufacturing process. For example, a center of the first groove 4, a center of the second groove 6 and a center of the third groove 8 are aligned with each other in the direction perpendicular to the first inorganic layer 2. It should be noted that in the present disclosure, the center of the groove (for example, the first groove, the second groove and the third groove) refers to, for example, in a case where a plane shape of the groove is a regular symmetrical pattern, the center of the groove is a geometric center of the regular symmetrical pattern. For example, in a case where the plane shape of the groove is rectangular, the center of the groove is an intersection point of diagonal lines of the rectangle. For example, in a case where the plane shape of the groove is circular, the center of the groove is a center of the circle.

For example, in the direction perpendicular to the first inorganic layer, any two of the first groove, the second groove and the third groove at least partially are not aligned with each other. For example, in the direction perpendicular to the first inorganic layer, any two of the center of the first groove, the center of the second groove and the center of the third groove are not aligned with each other. For example, FIG. 4C is a structural schematic diagram of further another flexible substrate provided by at least one embodiment of the present disclosure. The at least one embodiment illustrated in FIG. 4C differs from the at least one embodiment illustrated in FIG. 3 in that in the at least one embodiment illustrated in FIG. 4C, the first groove 4, the second groove 6 and the third groove 8 are not aligned with each other in the direction perpendicular to the first inorganic layer 2, for example, any two of the first groove 4, the second groove 6 and the third groove 8 partially are not aligned with each other in the direction perpendicular to the first inorganic layer 2. For example, the center of the first groove 4, the center of the second groove 6 and the center of the third groove 8 are not aligned with each other in the direction perpendicular to the first inorganic layer 2, so that the flexible substrate has a more uniform flexibility. Other features of the at least one embodiment illustrated in FIG. 4C are the same as those in FIG. 3.

In the flexible substrate illustrated in FIG. 3, the planarization layer 9 covers the second inorganic layer 7, and a surface 90, which is away from the second inorganic layer 7, of the planarization layer 9 is a flat surface. The planarization layer 9 provides a flat surface for providing a function layer (for example, a driving circuit layer or a light emitting layer, etc.) on the flexible substrate. For example, a material of the planarization layer 9 is a resin material such as polyacrylic resin or the like.

The flexible substrate illustrated in FIG. 3 includes two organic layers. Compared with the flexible substrate with only one organic layer, it is advantageous to obtain the flexible substrate with better performances, for example, the flexible substrate becomes more flexible. Further, two inorganic layers are provided to improve the ability of isolating moisture and oxygen of the flexible substrate. For example, in a case where the functional elements, such as an OLED device, are provided on the flexible substrate, a damage to the functional elements caused by moisture and oxygen is prevented, which is beneficial to prolonging service lives of the functional elements.

It should be noted that shapes of the second groove 6 and the third groove 8 are, for example, the same as those of the first groove 4. Please refer to the description of the first groove 4. For a material of the second organic layer 5, please refer to the previous description of the material of the first organic layer 3, and for a material of the second inorganic layer 7, please refer to the previous description of the material of the first inorganic layer 2, which are not repeated here.

Figure 4A:
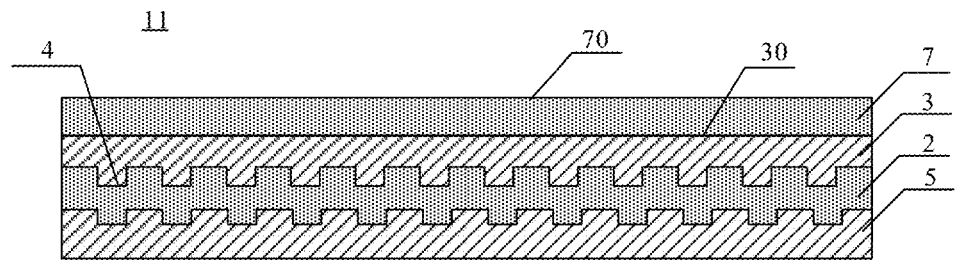
FIG. 4A is further another structural schematic diagram of the flexible substrate provided by at least one embodiment of the present disclosure.

FIG. 4A is a structural schematic diagram of further another flexible substrate provided by at least one embodiment of the present disclosure. As illustrated in FIG. 4A, a difference between the flexible substrate in FIG. 4A and the flexible substrate illustrated in FIG. 3 is that the surface 30, which is in contact with the second inorganic layer 7, of the first organic layer 3 of the flexible substrate is a flat surface, and the surface 70, which is away from the first organic layer 3, of the second inorganic layer 7 is also a flat surface, and thus, there is no need to provide the planarization layer in the flexible substrate, which simplifies the structure and manufacturing process of the flexible substrate. Other features of the flexible substrate illustrated in FIG. 4A are the same as those of the flexible substrate illustrated in FIG. 3, please refer to the previous description.

Figure 4B:
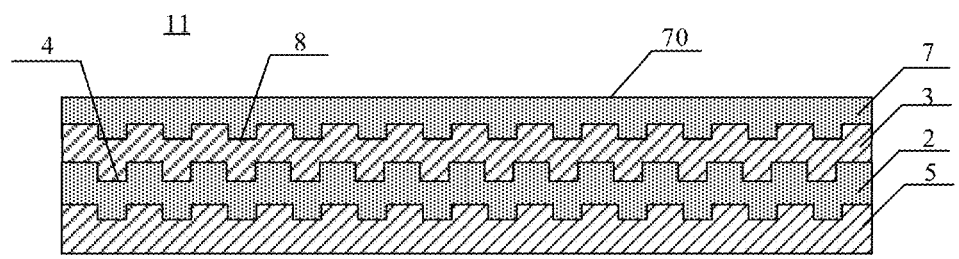
FIG. 4B is further another structural schematic diagram of the flexible substrate provided by at least one embodiment of the present disclosure.
Figure 4C:
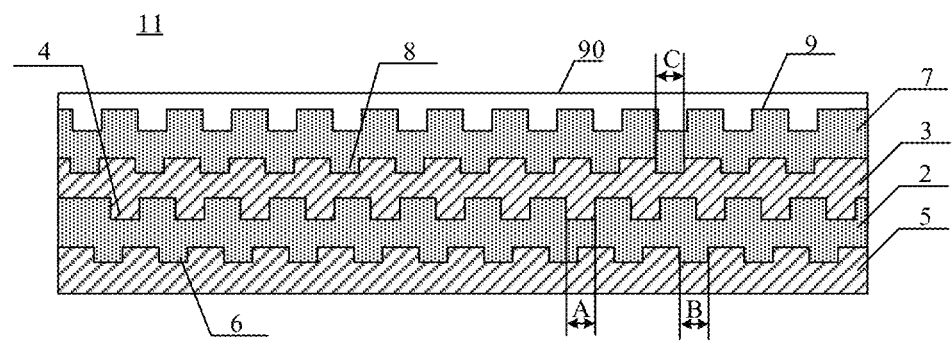
FIG. 4C is further another structural schematic diagram of the flexible substrate provided by at least one embodiment of the present disclosure.

FIG. 4B is a structural schematic diagram of further another flexible substrate provided by at least one embodiment of the present disclosure. As illustrated in FIG. 4B, the flexible substrate is different from the flexible substrate illustrated in FIG. 4A in that the surface, which is in contact with the second inorganic layer 7, of the first organic layer 3 of the flexible substrate has the third groove 8, and the surface 70, which is away from the first organic layer 3, of the second inorganic layer 7 is a flat surface. In this way, on one hand, compared with a case where the surface, which is in contact with the second inorganic layer 7, of the first organic layer 3 is a flat surface, the third groove 8 increases the contact area between the first organic layer 3 and the second inorganic layer 7, and thus the bonding strength between the first organic layer 3 and the second inorganic layer 7 is further improved, and the flexibility of the flexible substrate is further enhanced, and thereby the problems of separation or warp of the first organic layer 3 and the second inorganic layer 7 easily caused in the subsequent manufacturing process of the flexible substrate are reduced or prevented, which is beneficial to forming the flexible substrate with the better flexibility and improving the production yield rate of the flexible substrate; on the other hand, no additional planarization layer is required, so that the structure and the manufacturing process of the flexible substrate are simplified.

Figure 5A:
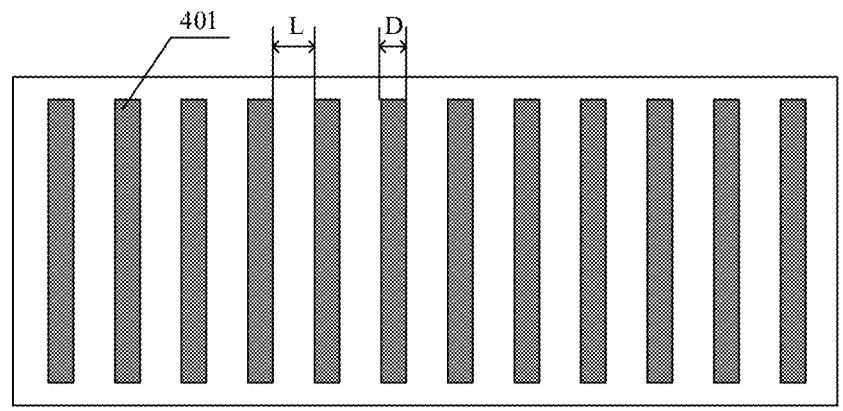
FIG. 5A is a schematic diagram of an orthographic projection of a first groove on a first organic layer in the flexible substrate provided by at least one embodiment of the present disclosure.
Figure 5B:
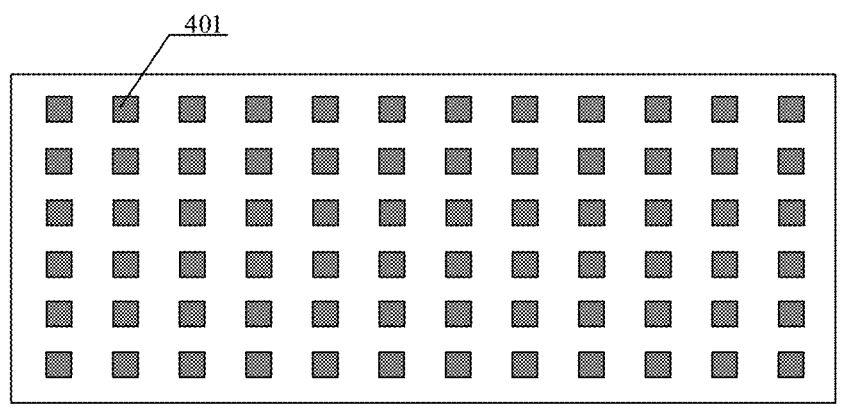
FIG. 5B is another schematic diagram of the orthographic projection of the first groove on the first organic layer in the flexible substrate provided by at least one embodiment of the present disclosure.

Features of the first groove, features of the second groove and features of the third groove in the embodiments of the present disclosure may be the same. The following description takes the first groove as an example, and the following features are also applicable to the second groove and the third groove. FIG. 5A is a schematic diagram of an orthographic projection of the first groove on the first inorganic layer in the flexible substrate provided by at least one embodiment of the present disclosure, and FIG. 5B is another schematic diagram of the orthographic projection of the first groove on the first inorganic layer in the flexible substrate provided by at least one embodiment of the present disclosure. For example, as illustrated in FIG. 5A, the orthographic projection 401 of the first groove on the first inorganic layer is in a strip shape. For example, widths D of the orthographic projections 401 of a plurality of first grooves on the first inorganic layer are equal with each other, and intervals L between the orthographic projections 401 of any two adjacent ones of the plurality of first grooves on the first inorganic layer are equal with each other, so that the flexible substrate has a relatively uniform flexibility. For example, as illustrated in FIG. 5B, the orthographic projection 401 of the first groove on the first inorganic layer is in a dot shape. For example, shapes and sizes of the orthographic projections 401 of the plurality of dot-like first grooves on the first inorganic layer are same with each other, and the orthographic projections 401 of the plurality of dot-like first grooves on the first inorganic layer are uniformly distributed on the first inorganic layer, so that the flexible substrate has the relatively uniform flexibility. FIG. 5A and FIG. 5B illustrate only examples of the shape of the orthographic projection of the first groove on the first inorganic layer, and the orthographic projection of the first groove on the first inorganic layer may be in other shapes, such as a circular shape, a pentagonal shape or the like. No limitation is imposed to the shape of the orthographic projection of the first groove on the first inorganic layer in the embodiments of the present disclosure.

It should be noted that the orthographic projection of the groove in the disclosure refers to an orthographic projection of a bottom surface of the groove. The bottom surface refers to a bottom surface of the groove in a direction parallel to the first inorganic layer. For example, as illustrated in FIG. 3, the orthographic projection of the first groove refers to an orthographic projection of a region A of the first groove; the orthographic projection of the second groove refers to an orthographic projection of a region B of the second groove; the orthographic projection of the third groove refers to an orthographic projection of a region C of the third groove.

Figure 6A:
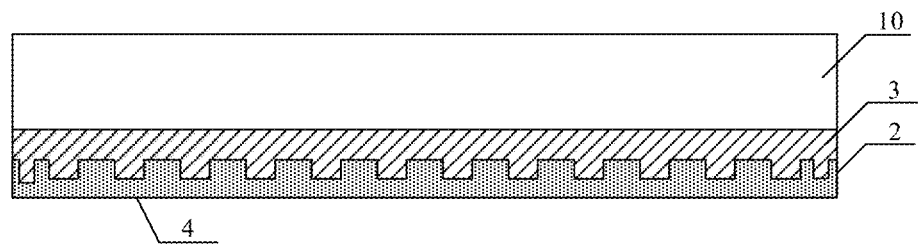
FIG. 6A is further another structural schematic diagram of the flexible substrate provided by at least one embodiment of the present disclosure.
Figure 6B:
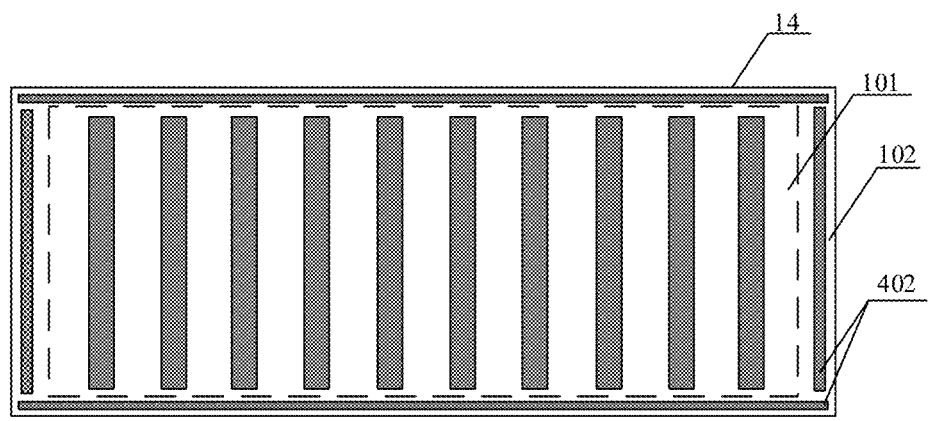
FIG. 6B is a schematic diagram of an orthographic projection of the first groove on a function layer in the flexible substrate illustrated in FIG. 6A.

FIG. 6A is a structural schematic diagram of further another flexible substrate provided by at least one embodiment of the present disclosure, FIG. 6B is a schematic diagram of an orthographic projection of the first groove on a function layer in the flexible substrate illustrated in FIG. 6A. Referring to FIG. 6A and FIG. 6B, the flexible substrate further includes a function layer 10. The function layer 10 is on the first organic layer 3 and includes a working region 101 and a non-working region 102 outside the working region 101. It should be noted that the description "non-working region 102 outside the working region 101" refers to that the non-working region 102 is at a side, which is close to an outer edge 14 of the flexible substrate, of the working region 101. For example, the function layer 10 is used for display or lighting. For example, the function layer 10 is a driving circuit layer, which for example is provided with a gate driving circuit or a data driving circuit. For another example, the function layer 10 is a light emitting layer, and for example, the function layer 10 includes an OLED device for display or lighting. Of course, the function layer 10 is not limited to the types listed above. As illustrated in FIG. 6B, a portion 402 of the orthographic projection of the first groove 4 on the function layer 10 overlaps with a portion of the non-working region 102. For example, the non-working region 102 close to the outer edge 14 of the flexible substrate is a bending region which requires a high flexibility. In FIG. 6B, the portion 402 of the orthographic projection of the first groove 4 on the function layer 10 is in the bending region, so that the flexible substrate has a better flexibility in the bending region, and the problems of separation or warp of the flexible substrate in the bending region are reduced or prevented, which is beneficial to further improving the production yield rate of the flexible substrate. It should be noted that in FIG. 6B, the portion 402 of the orthographic projection of the first groove 4 on the function layer 10 is respectively disposed along four outer edges 14 of the flexible substrate; however, in other embodiments, the portion 402 of the orthographic projection of the first groove 4 on the function layer 10 may be disposed along only one, two or three of the outer edges 14 of the flexible substrate as required.

It should be noted that FIG. 6A and FIG. 6B take the first groove as an example. In the embodiments of the present disclosure, the orthographic projection of at least one of the first groove, the second groove and the third groove on the function layer at least partially overlaps with the non-working region, in this case, a technical effect similar to the example illustrated in FIG. 6B is also achieved. For example, for the flexible substrate illustrated in FIG. 3, the function layer is disposed on the planarization layer 9. For example, for the flexible substrate illustrated in FIG. 4A and FIG. 4B, the function layer is disposed on the second inorganic layer 7.

Figure 7:
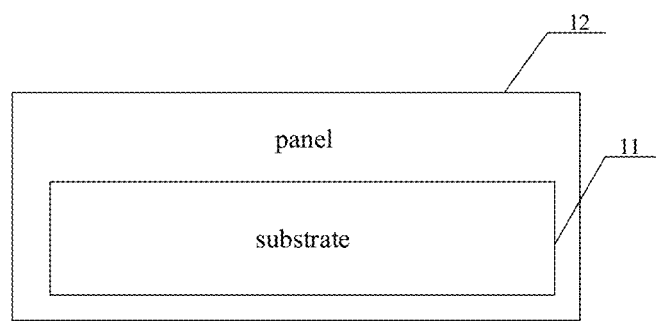
FIG. 7 is a schematic diagram of a panel provided by at least one embodiment of the present disclosure.

At least one embodiment of the present disclosure further provides a panel, the panel includes any one of the flexible substrates provided by the embodiments of the present disclosure. FIG. 7 is a schematic diagram of a panel provided by at least one embodiment of the present disclosure. As illustrated in FIG. 7, the panel 12 includes any one of the flexible substrates 11 provided by the embodiments of the present disclosure. For example, the panel 12 is a display panel, such as an OLED display panel. For example, the panel 12 is a flexible panel. The panel is, for example, a flexible OLED display panel. For example, the panel 12 is a panel for lighting, for example, the panel 12 is used for decorative lamps and is bendable to meet requirements of decorative lamps.

It should be noted that FIG. 7 only illustrates the components of the panel 12 directly related to the flexible substrate 11, for other structures of the panel 12 and connection relationships between the flexible substrate 11 and the other structures, those skilled in the art may refer to conventional technologies. All the structures in FIG. 7 are exemplary.

Figure 8:
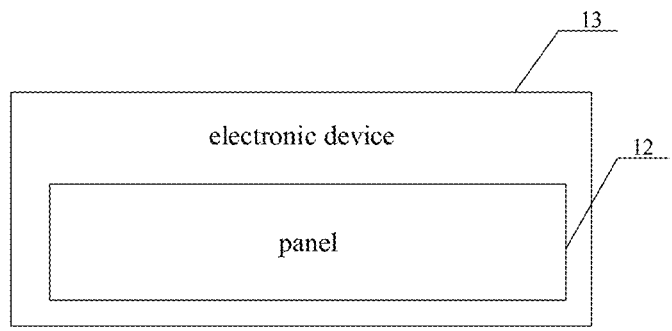
FIG. 8 is a schematic diagram of an electronic device provided by at least one embodiment of the present disclosure.

At least one embodiment of the present disclosure further provides an electronic device, the electronic device includes any one of the panels provided by the embodiments of the present disclosure. FIG. 8 is a schematic diagram of an electronic device provided by at least one embodiment of the present disclosure. As illustrated in FIG. 8, the electronic device 13 includes any one of the panels 12 provided by the embodiments of the present disclosure.

For example, the electronic device is a display device, such as an OLED display device. The display device is a flexible display device. For example, the electronic device is a lighting device which emits monochromatic light, such as white light, red light, green light or blue light; for example, the electronic device is a lighting device which emits other colored light obtained by combining red, green and blue (RGB) according to requirements. The lighting device is, for example, a lighting lamp, a decorative lamp or the like, and the display device is a display panel, a billboard or the like.

It should be noted that FIG. 8 only illustrates components of the electronic device 13 directly related to the panel 12, for other structures of the electronic device and connection relationships between the panel 12 and the other structures, those skilled in the art may refer to conventional technologies. All the structures in FIG. 8 are exemplary.

At least one embodiment of the present disclosure further provides a manufacturing method of a flexible substrate, and the manufacturing method includes: providing a base substrate; forming a first inorganic layer on the base substrate; forming a first groove on a surface, which is away from the base substrate, of the first inorganic layer; and forming a first organic layer in contact with the first inorganic layer on the first inorganic layer.

Figure 9A:
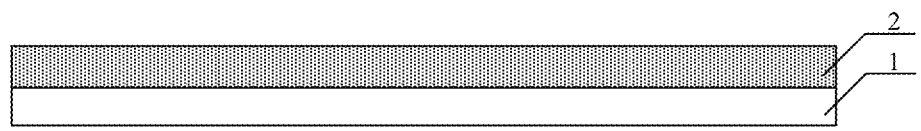
FIG. 9A-FIG. 9D are schematic diagrams of a manufacturing method of a flexible substrate provided by at least one embodiment of the present disclosure.

For example, FIG. 9A-FIG. 9D are schematic diagrams of a manufacturing method of a flexible substrate provided by at least one embodiment of the present disclosure. As illustrated in FIG. 9A, a base substrate 1 is provided, and the first inorganic layer 2 is formed on the base substrate 1. For example, the first inorganic layer 2 is formed by a chemical vapor deposition (CVD) method or a magnetron sputtering method. For example, a material of the first inorganic layer 2 is silicon oxide, silicon nitride, silicon oxynitride or the like. Of course, a material of the first inorganic layer 1 is not limited to the above listed types, as long as it is an inorganic layer with a better ability of isolating moisture and oxygen.

Figure 9B:
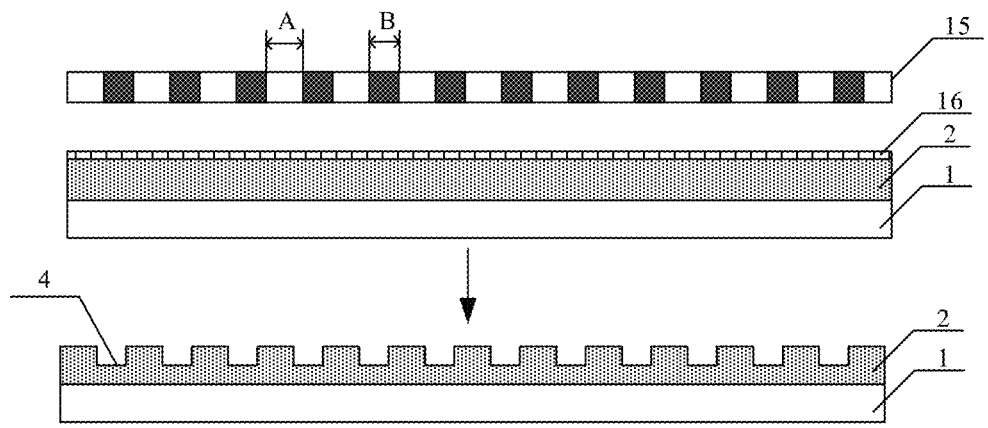

As illustrated in FIG. 9B, the first groove 4 is formed on a surface, which is away from the base substrate 1, of the first inorganic layer 2. For example, the first groove 4 is formed by a photolithography process. A mask plate 15 including a light transmission region A and a light shielding region B for example is used in an exposure process. A photoresist layer 16 is coated on the first inorganic layer 2; for example, in FIG. 9B, the photoresist is a negative photoresist. Of course, in other examples, the photoresist may be a positive photoresist. The light shielding region B is aligned with a region, which is for forming the first groove, of the first inorganic layer 2, and the light transmission region A is aligned with other regions of the first inorganic layer 2, then the first inorganic layer 2 is exposed. The first groove 4 is formed on the first inorganic layer 2 as illustrated in FIG. 9B after a developing process, an etching process and a photoresist stripping process.

Figure 9C:
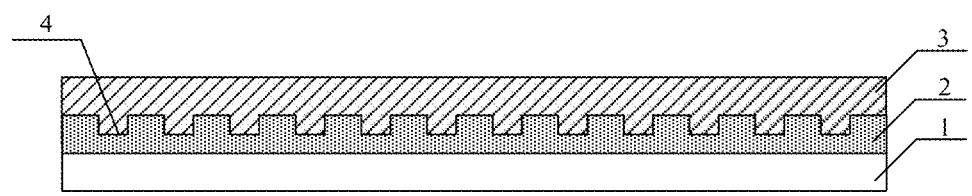

As illustrated in FIG. 9C, the first organic layer 3 in contact with the first inorganic layer 2 is formed on the first inorganic layer 2. For example, the first organic layer 3 is formed by coating. The first groove 4 increases the contact area between the first organic layer 3 and the first inorganic layer 2, so that the adhesion force between the first organic layer 3 formed by coating and the first inorganic layer 2 is enhanced, and the bonding strength between the first organic layer 3 and the first inorganic layer 2 is improved. This method reduces or prevents the problems of a poor bonding force between the first organic layer 3 and the first inorganic layer 2 and separation or warp easily caused in the subsequent manufacturing process of the flexible substrate, and is beneficial to obtaining the flexible substrate with a better flexibility and improving a production yield rate of the flexible substrate.

Figure 9D:
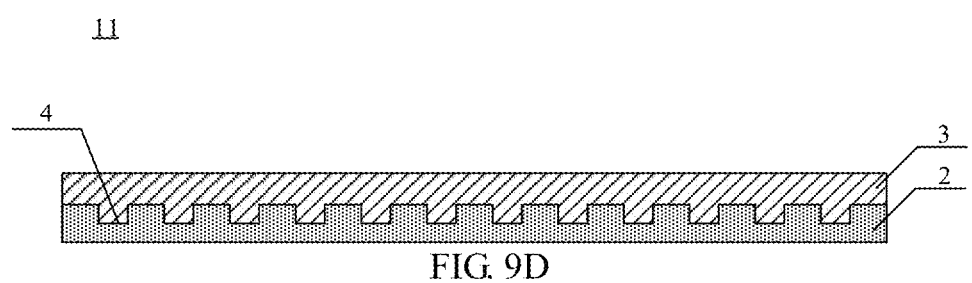

As illustrated in FIG. 9D, the first organic layer 3 is cured. For example, the first organic layer 3 is cured by heating, and a method of heating may be infrared heating, heating in a heating furnace, etc. Then, the base substrate 1 is peeled off to obtain the flexible substrate 11.

Figure 10A:
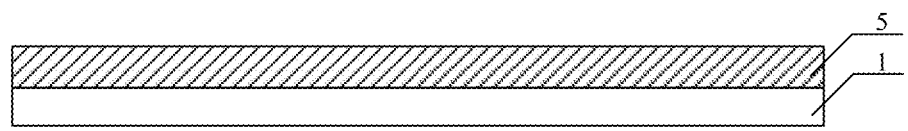
FIG. 10A-FIG. 10G are another schematic diagrams of the manufacturing method of the flexible substrate provided by at least one embodiment of the present disclosure.

For example, FIG. 10A-FIG. 10G are schematic diagrams of another manufacturing method of the flexible substrate provided by at least one embodiment of the present disclosure. As illustrated in FIG. 10A, the base substrate 1 is provided, and the second organic layer 5 is formed on the base substrate 1. For example, the second organic layer 5 is formed by coating. The second organic layer 5 is cured. For example, the second organic layer 5 is cured by heating, and the method of heating may be infrared heating, heating in a heating furnace, etc. A material of the second organic layer is the same as that of the first organic layer, please refer to the description above about the material of the first organic layer.

Figure 10B:
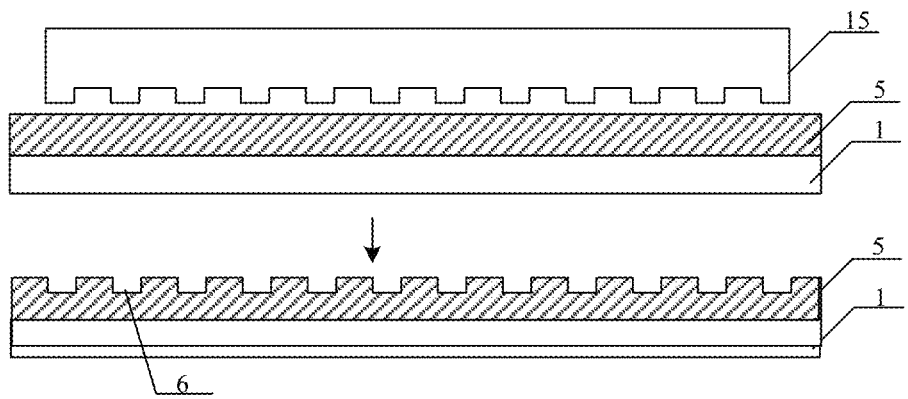
Figure 10C:
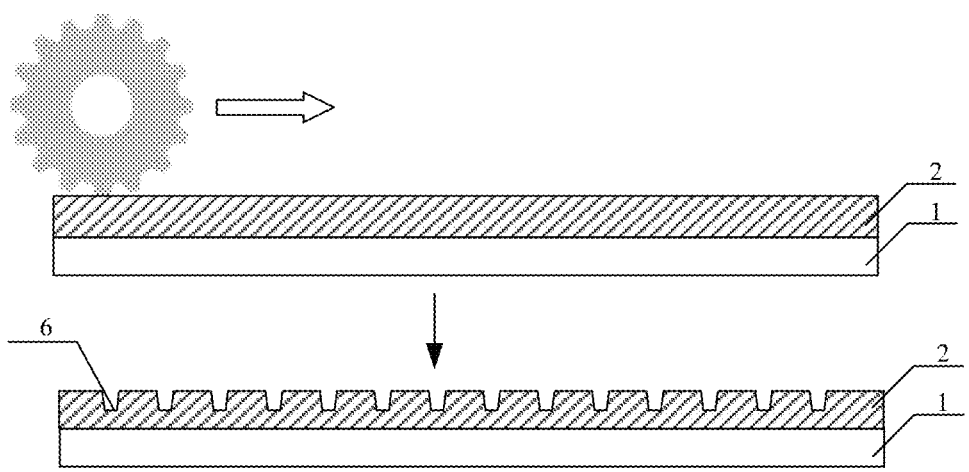

As illustrated in FIG. 10B, the second groove 6 is formed on a surface, which is away from the base substrate 1, of the second organic layer 5, that is, a surface to be in contact with the first inorganic layer to be formed subsequently. For example, the second groove 6 is formed by a method of imprint. For example, as illustrated in FIG. 10B, the second organic layer 5 is imprinted with an imprint template 15 having a pattern of the second groove to form the second groove 6. For example, as illustrated in FIG. 10C, the second groove 6 is formed by a method of imprint using a roller. For example, the roller is provided with gears. The roller is moved in a direction of the arrow in FIG. 10C to perform the imprint to form the second groove 6. Therefore, a cross section of the second groove 6 in a direction perpendicular to the base substrate is wedge-shaped.

For example, it should be noted that the following description takes the second groove 6 illustrated in FIG. 10B as an example.

Figure 10D:
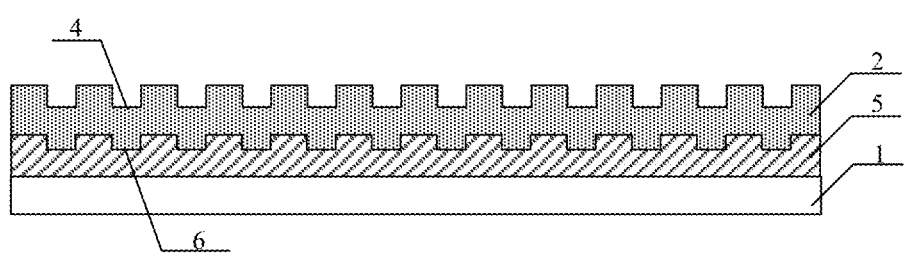

As illustrated in FIG. 10D, the first inorganic layer 2 is formed on the second organic layer 5 by a method of chemical vapor deposition (CVD) method or a method of magnetron sputtering, and the first inorganic layer 2 is in contact with the second organic layer 5. By designing an appropriate depth of the second groove 6 and an appropriate thickness of the first inorganic layer 2, the first groove 4 having a shape similar to that of the second groove 6 is formed on the surface, which is away from the base substrate 1, of the first inorganic layer 2 at the time of forming the first inorganic layer 2, which is beneficial to simplifying a manufacturing process of the flexible substrate, improving a production efficiency and reducing a production cost. Or, in other examples, after the first inorganic layer 2 is formed, the first groove 4 having a desired depth and shape is formed on the surface, which is away from the base substrate 1, of the first inorganic layer 2 by a photolithography process. The second groove 6 increases the contact area of the second organic layer 5 with the first inorganic layer 2. On one hand, the bonding strength between the second organic layer 5 and the first inorganic layer 2 is further improved. On the other hand, the flexibility of the flexible substrate is further enhanced, and thereby problems of separation or warp of the second organic layer 5 and the first inorganic layer 2 easily caused in the subsequent manufacturing process of the flexible substrate are reduced or prevented, which is beneficial to forming the flexible substrate with the better flexibility and improving the production yield rate of the flexible substrate.

Figure 10E:
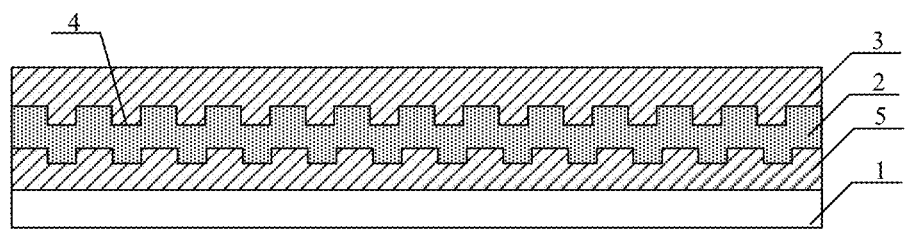

As illustrated in FIG. 10E, the first organic layer 3 in contact with the first inorganic layer 2 is formed on the first inorganic layer 2, that is, the second organic layer 5 is on a side, which is away from the first organic layer 3, of the first inorganic layer 2. For example, the first organic layer 3 is formed by coating.

Figure 10F:
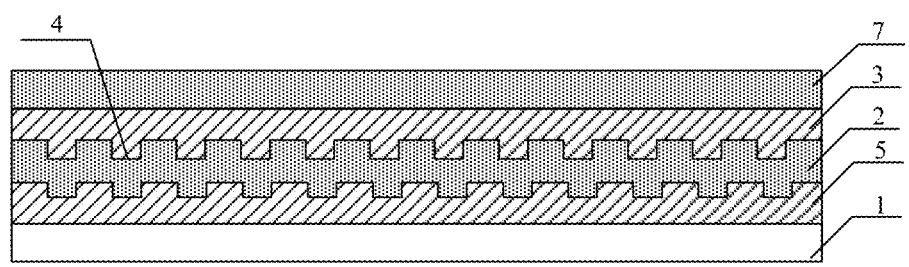

As illustrated in FIG. 10F, the second inorganic layer 7 is formed on the first organic layer 3. The surface, which is away from the first organic layer 3, of the second inorganic layer 7 is a flat surface. For example, the second inorganic layer 7 is formed by the method of chemical vapor deposition (CVD) or the method of magnetron sputtering. A material of the second inorganic layer 7 may be the same as that of the first inorganic layer 2, please refer to the description above about the material of the first inorganic layer 2.

Figure 10G:
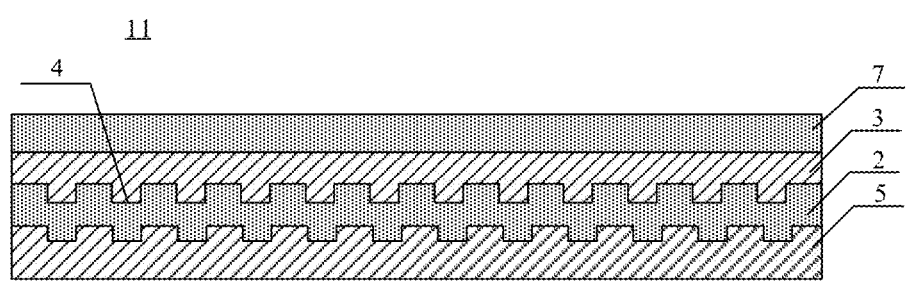

As illustrated in FIG. 10G, the flexible substrate 11 is obtained after peeling off the base substrate 1.

Figure 11A:
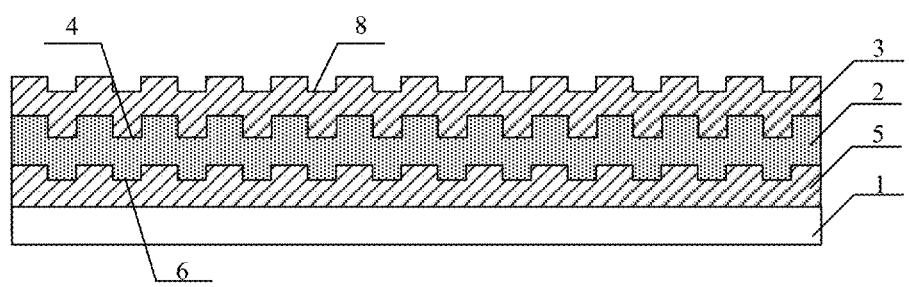
FIG. 11A-FIG. 11F are further another schematic diagrams of the manufacturing method of the flexible substrate provided by at least one embodiment of the present disclosure.
Figure 11B:
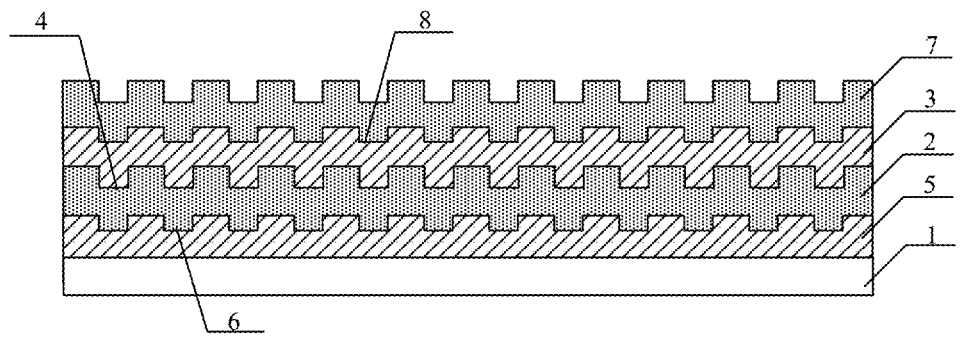

FIG. 11A-FIG. 11F are schematic diagrams of further another manufacturing method of the flexible substrate provided by at least one embodiment of the present disclosure. As illustrated in FIG. 11A, on the basis of forming the structure illustrated in FIG. 10E, the third groove 8 is formed on a surface, which is away from the base substrate 1, of the first organic layer 3, that is, a surface of the first organic layer 3 to be in contact with the second inorganic layer to be formed subsequently. A manufacturing method of the third groove 8 is the same as that of the second groove 6 and may be referred to the above description and is be repeated here. Or, by designing an appropriate depth of the second groove 6, an appropriate thickness of the first inorganic layer 2 and an appropriate thickness of the first organic layer 3, the third groove 8 having a shape similar to that of the second groove 6 is formed on the surface, which is away from the base substrate 1, of the first organic layer 3 at the time of forming the first organic layer 3. For example, as illustrated in FIG. 11A, the first groove 4, the second groove 6 and the third groove 8 are formed, the first groove 4, the second groove 6 and the third groove 8 are aligned with each other in the direction perpendicular to the first inorganic layer by designing positions of the first groove 4, the second groove 6 and the third groove 8. For example, in the direction perpendicular to the first inorganic layer 2, the center of the first groove 4, the center of the second groove 6 and the center of the third groove 8 are aligned with each other. Please refer to the previous description of the center of the first groove 4, the center of the second groove 6 and the center of the third groove 8 illustrated in FIG. 3. For example, in other embodiments, it is also possible to design the positions of the first groove 4, the second groove 6 and the third groove 8 so that any two of the first groove 4, the second groove 6 and the third groove 8 at least partially are not aligned with each other in the direction perpendicular to the first inorganic layer. For example, in the direction perpendicular to the first inorganic layer 2, any two of the center of the first groove 4, the center of the second groove 6 and the center of the third groove 8 are not aligned with each other in the direction perpendicular to the first inorganic layer 2. Please refer to the previous description of the center of the first groove 4, the center of the second groove 6 and the center of the third groove 8 illustrated in FIG. 4C. As illustrated in FIG. 11B, the second inorganic layer 7 is formed on the first organic layer 3 by the method of chemical vapor deposition (CVD) or the method of magnetron sputtering, and the second inorganic layer 7 is in contact with the first organic layer 3. Because of an influence of the third groove 8, a surface, which is away from the base substrate 1, of the second inorganic layer 7 is not a flat surface.

Figure 11C:
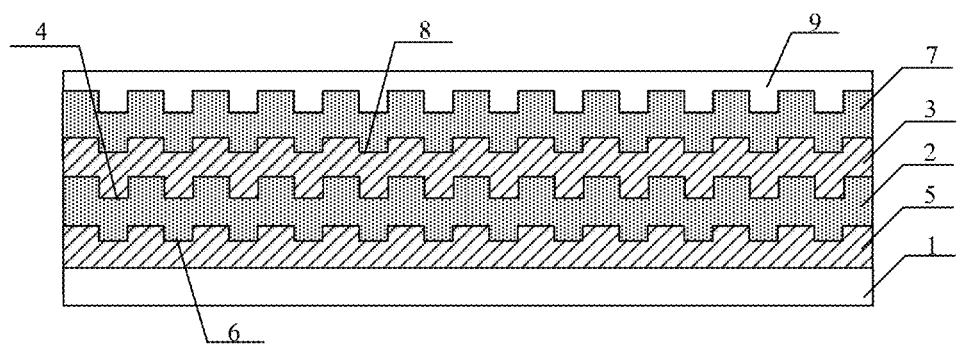

As illustrated in FIG. 11C, the planarization layer 9 covering the second inorganic layer 7 is formed, and a surface, which is away from the second inorganic layer 7, of the planarization layer 9 is a flat surface. The planarization layer 9 provides the flat surface for providing the function layer (for example, a driving circuit layer or a light emitting layer, etc.) on the flexible substrate. For example, the material of the planarization layer 9 is a resin material such as polyacrylic resin or the like.

Figure 11D:
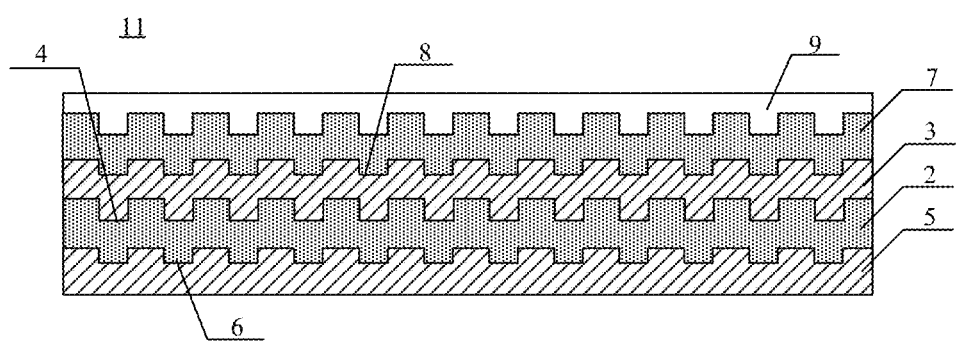

As illustrated in FIG. 11D, the flexible substrate 11 is obtained after peeling off the base substrate 1.

Figure 11E:
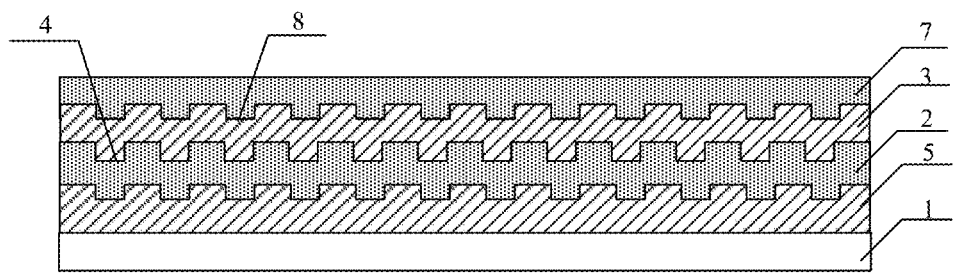

In another example, as illustrated in FIG. 11E, after forming the structure illustrated in FIG. 11A, the second inorganic layer 7 having a flat surface is formed on the first organic layer 3 by the method of chemical vapor deposition (CVD) by designing an appropriate depth of the third groove 8 and an appropriate thickness of the second inorganic layer 7. In this way, there is no need to form an additional planarization layer, which is beneficial to simplifying the manufacturing process of the flexible substrate, improving the production efficiency and reducing the production cost.

Figure 11F:
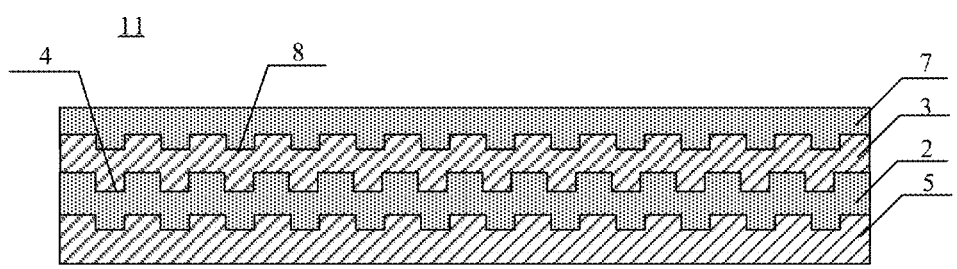

As illustrated in FIG. 11F, the flexible substrate 11 is obtained after peeling off the base substrate 1.

Figure 12:
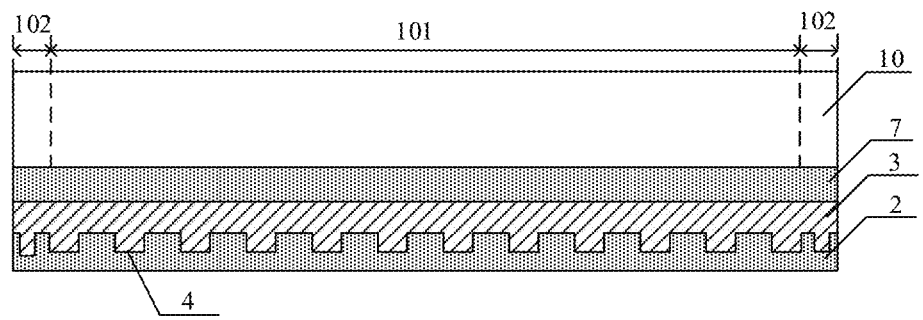
FIG. 12 is further another schematic diagram of the manufacturing method of the flexible substrate provided by at least one embodiment of the present disclosure.

For example, FIG. 12 is a schematic diagram of further another manufacturing method of the flexible substrate provided by at least one embodiment of the present disclosure. This method is implemented on the basis of the structure illustrated in FIG. 9D. Of course, this method may also be implemented on the basis of the structure illustrated in FIG. 10G or FIG. 11D. As illustrated in FIG. 12, the manufacturing method further includes forming the function layer 10 on the first organic layer 3. The function layer 10 includes the working region 101 and the non-working region 102 outside the working region 101. The orthographic projection of the first groove on the function layer 10 overlaps with a portion of the non-working region 102. For example, the working region is a display region for achieving display. For example, the non-working region 102 is a bending region which requires a high flexibility. The portion 402 of the orthographic projection of the first groove 4 on the function layer 10 is in the bending region, which enables the flexible substrate to have better flexibility in the bending region, reduces or prevents the problems of separation or warping of the flexible substrate in the bending region, and is beneficial to further improving the production yield rate of the flexible substrate.

For example, the function layer 10 is used for display or light. For example, the function layer 10 is a driving circuit layer, which for example is provided with a gate driving circuit or a data driving circuit. For another example, the function layer 10 is a light emitting layer, and for example, the function layer 10 includes an OLED device for display or lighting. Of course, the function layer 10 is not limited to the types listed above. The specific method of forming the function layer 10 may be referred to conventional techniques in the art.

It should be noted that in at least one embodiment of the present disclosure, at least one of the orthographic projection of the first groove, the orthographic projection of the second groove and the orthographic projection of the third groove on the function layer at least partially overlaps the non-working region, in this case, a technical effect similar to that of the example illustrated in FIG. 12 is also achieved.

What have been described above are only specific implementations of the present disclosure, the protection scope of the present disclosure is not limited thereto. The protection scope of the present disclosure should be based on the protection scope of the claims.

What is claimed is:

1. A flexible substrate, comprising:
   a first inorganic layer;
   a first organic layer on the first inorganic layer and in contact with the first inorganic layer;
   wherein a surface, which is in contact with the first organic layer, of the first inorganic layer has a first groove;

the flexible substrate further comprises a function layer on the first organic layer, the function layer is a driving circuit layer or a light emitting layer, and the function layer comprises a working region and a non-working region outside the working region, the non-working region comprises a bending region;

the first groove is recessed along a direction away from the function layer;

an orthographic projection of the first groove on the function layer at least partially overlaps with the non-working region, and a portion, overlapping with the non-working region, of the orthographic projection of the first groove on the function layer is in the bending region.

2. The flexible substrate according to claim 1, further comprising:

a second inorganic layer on a side, which is away from the first inorganic layer, of the first organic layer, wherein a surface, which is away from the first organic layer, of the second inorganic layer is a flat surface.

3. A panel, comprising the flexible substrate according to claim 1.

4. An electronic device, comprising the panel according to claim 3.

5. The flexible substrate according to claim 1, further comprising:

a second organic layer on a side, which is away from the first organic layer, of the first inorganic layer and in contact with the first inorganic layer, wherein a surface, which is in contact with the first inorganic layer, of the second organic layer has a second groove.

6. The flexible substrate according to claim 5, wherein each of a material of the first organic layer and a material of the second organic layer comprises one or more of polyimide, polyester and polyfluoride.

7. The flexible substrate according to claim 5, further comprising:

a second inorganic layer on a side, which is away from the first inorganic layer, of the first organic layer and in contact with the first organic layer, wherein a surface, which is in contact with the second inorganic layer, of the first organic layer has a third groove.

8. The flexible substrate according to claim 7, further comprising:

a planarization layer covering the second inorganic layer, wherein a surface, which is away from the second inorganic layer, of the planarization layer is a flat surface.

9. The flexible substrate according to claim 7, wherein at least one of an orthographic projection of the first groove on the first inorganic layer, an orthographic projection of the second groove on the first inorganic layer and an orthographic projection of the third groove on the first inorganic layer is in a strip shape or in a dot shape.

10. The flexible substrate according to claim 7, wherein each of a material of the first inorganic layer and a material of the second inorganic layer comprises one or more of silicon oxide, silicon nitride and silicon oxynitride.

11. The flexible substrate according to claim 7, wherein at least one of an orthographic projection of the second groove on the function layer and an orthographic projection of the third groove on the function layer at least partially overlaps with the non-working region.

12. The flexible substrate according to claim 7, wherein in a direction perpendicular to the first inorganic layer, any two of the first groove, the second groove and the third groove at least partially are not aligned with each other.

13. A manufacturing method of a flexible substrate, comprising:

providing a base substrate;

forming a first inorganic layer on the base substrate;

forming a first groove on a surface, which is away from the base substrate, of the first inorganic layer; and forming a first organic layer in contact with the first inorganic layer on the first inorganic layer;

the method further comprises forming a function layer on the first organic layer, the function layer is a driving circuit layer or a light emitting layer, and the function layer comprises a working region and a non-working region outside the working region, the non-working region comprises a bending region;

the first groove is recessed along a direction away from the function layer;

an orthographic projection of the first groove on the function layer at least partially overlaps with the non-working region, and a portion, overlapping with the non-working region, of the orthographic projection of the first groove on the function layer is in the bending region.

14. The manufacturing method according to claim 13, further comprising:

forming a second inorganic layer on the first organic layer, wherein the surface of the second inorganic layer which is away from the first organic layer is a flat surface.

15. The manufacturing method according to claim 13, wherein the first groove is formed by a photolithography process.

16. The manufacturing method according to claim 13, further comprising:

forming a second organic layer on a side, which is away from the first organic layer, of the first inorganic layer and in contact with the first inorganic layer; and forming a second groove on a surface, which is in contact with the first inorganic layer, of the second organic layer.

17. The manufacturing method according to claim 16, further comprising:

forming a second inorganic layer in contact with the first organic layer on the first organic layer; and forming a third groove on a surface, which is in contact with the second inorganic layer, of the first organic layer.

18. The manufacturing method according to claim 17, further comprising:

forming a planarization layer covering the second inorganic layer, wherein a surface, which is away from the second inorganic layer, of the planarization layer is a flat surface.

19. The manufacturing method according to claim 17, wherein at least one of the second groove and the third groove is formed by an imprint process.

20. The manufacturing method according to claim 17, wherein at least one of an orthographic projection of the second groove on the function layer and an orthographic projection of the third groove on the function layer at least partially overlaps with the non-working region.

* * * * *